(12) United States Patent
Lee et al.

(10) Patent No.: US 8,076,996 B2
(45) Date of Patent: Dec. 13, 2011

(54) HYBRID BALUN APPARATUS

(75) Inventors: Young Jae Lee, Daegu (KR); Cheon Soo Kim, Daejeon (KR); Hyun Kyu Yu, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 278 days.

(21) Appl. No.: 12/608,183

(22) Filed: Oct. 29, 2009

(65) Prior Publication Data
US 2010/0201457 A1    Aug. 12, 2010

(30) Foreign Application Priority Data

Feb. 10, 2009 (KR) .................. 10-2009-0010524
May 7, 2009 (KR) .................. 10-2009-0039866

(51) Int. Cl.
*H01P 5/12* (2006.01)
*H03H 11/42* (2006.01)
(52) U.S. Cl. ................... 333/117; 333/25
(58) Field of Classification Search .......... 333/117, 333/25, 26
See application file for complete search history.

(56) References Cited

U.S. PATENT DOCUMENTS

| | | | |
|---|---|---|---|
| 6,064,872 A * | 5/2000 | Vice | 455/326 |
| 6,919,858 B2 | 7/2005 | Rofougaran et al. | |
| 7,129,803 B2 | 10/2006 | Khorram et al. | |
| 7,245,887 B2 | 7/2007 | Khorram | |
| 7,603,091 B2 * | 10/2009 | Shin | 455/193.1 |
| 2007/0152904 A1 | 7/2007 | Castaneda et al. | |
| 2007/0243845 A1 | 10/2007 | Shin | |
| 2010/0296977 A1 * | 11/2010 | Hancock | 422/186 |

FOREIGN PATENT DOCUMENTS

KR    10-0740951 B    7/2007

OTHER PUBLICATIONS

Hyunchol Shin et al., "A 2.4-GHz 0.82-mW Hybrid Balun for Low-Power Fully-Differential Direct Conversion Receivers in 0.18 μm CMOS", 2007 IEEE Radio Frequency Integrated Circuits Symposium, pp. 617-620, May 2007.
Tze Kiu Lee, "Power amplifier/low noise amplifier RFswitch", Electronics Letters, Nov. 23, 2000, pp. 1983-1984, vol. 36 No. 24.

* cited by examiner

*Primary Examiner* — Dean O Takaoka
(74) *Attorney, Agent, or Firm* — Rabin & Berdo, P.C.

(57) ABSTRACT

A hybrid balun apparatus are disclosed. The hybrid balun apparatus can support both the reception mode and the transmission mode and be advantageous for a high level of integration, by replacing two transformers disposed at a reception path and a transmission path with a single transformer and integrating a T/R switch and a balun into a one chip. Therefore, an IC according to integration extends to a front stage of an antenna to facilitate interfacing between elements, and a burden for designing at a rear stage (i.e., LNA in the reception mode, and PA in the transmission mode) can be reduced.

16 Claims, 6 Drawing Sheets

HYBRID BALUN APPARATUS

CROSS-REFERENCE TO RELATED APPLICATIONS

This application claims the priorities of Korean Patent Application Nos. 10-2009-0010524 filed on Feb. 10, 2009, and 10-2009-0039866 filed on May 7, 2009 in the Korean Intellectual Property Office, the disclosures of which are incorporated herein by reference.

BACKGROUND OF THE INVENTION

1. Field of the Invention

The present invention relates to a hybrid balun apparatus and, more particularly, to a hybrid balun apparatus supporting both reception and transmission modes and being advantageous for a high level of integration.

2. Description of the Related Art

In the past, RF baluns and transmission/reception switches (T/R SW) were separately designed or integrated, rather than being designed as a one chip.

RF baluns are divided into an RF balun designed with a passive element and an RF balun designed with an active element.

A passive element commonly uses a structure with a transformer, and structures of actually used transformers are different in designs and variably implemented. Such a passive element has good linearity but with a loss of signal.

An active element is designed with a CMOS transistor to generate differential signals having the same signal size but with a phase difference of 180°, which has a relatively good gain but is disadvantageous in that power is wasted and its linearity is worse than that of the passive element.

Thus, recently, a balun apparatus having a hybrid structure combining a passive element and an active element has been proposed.

FIG. 1 illustrates the prior art hybrid balun apparatus.

As shown in FIG. 1, the prior art hybrid balun apparatus includes a band pass filter (BPF) 10 that filters a frequency band of a signal received via an antenna, a T/R switch 21 that selects a transmission path of a signal, two transformers 22 and 23 positioned at a reception path and a transmission path, respectively, a differential low noise amplifier (LNA) 30 that amplifies a signal transmitted via the transformer 22 positioned at the reception path, and a differential power amplifier (PA) 40 that applies a signal desired to be output, to the transformer 23 positioned at the transmission path.

In a reception mode, a signal input via the antenna passes through the BPF 10 so as to be filtered into a signal of a desired band, which then passes to the transformer 22 through the reception path so as to be input to the differential LNA 30.

Conversely, in a transmission mode, a signal applied via the differential PA 40 passes through the transformer 23 on the transmission path so as to be changed into a single-ended signal, which is then output to the antenna through the T/R switch 22 and the BPF 10.

In this manner, the prior art hybrid balun apparatus supports both the reception mode and the transmission mode by using the two transformers and the single T/R switch.

However, the two transformers provided at the reception path and the transmission path, respectively, occupy a relatively larger area, impeding a high level of integration of the hybrid balun apparatus.

In addition, when the signal passes through the T/R switch, a great deal of loss occurs in the signal, and it is noted that isolation characteristics between the reception path and the transmission path, and the like, are degraded in comparison with the performance of a commercial chip.

SUMMARY OF THE INVENTION

An aspect of the present invention provides a hybrid balun apparatus capable of supporting both reception mode and transmission mode and being advantageous for a high level of integration, by integrating a T/R switch and a balun and replacing two transformers disposed at a reception path and a transmission path with a single transformer.

According to an aspect of the present invention, there is provided a hybrid balun apparatus including: a passive unit having a single transformer that generates a pair of reception signals corresponding to an input signal applied to an input port and outputs the pair of reception signals to a pair of output ports, or generates an output signal corresponding to a pair of transmission signals applied to the pair of output ports and outputs the output signal to the input port; first and second active units that generate a pair of compensation reception signals corresponding to the input signal and apply the pair of generated compensation reception signals to the pair of output ports; third and fourth active units that apply the pair of transmission signals to the pair of output ports; and switching units that form a reception path along which the input signal is transferred to a pair of reception nodes via the transformer and the first and second active units in a reception mode, and form a transmission path along which the pair of transmission signals, which have been applied to a pair of transmission nodes, are output to the input port via the third and fourth active units and the transformer.

The passive unit may include: a transformer including a primary coil having one end connected to the input port and the other end connected to a ground voltage and a secondary coil electromagnetically connected with the primary coil and having both ends connected to the pair of output ports; and a first capacitor connected to a bias voltage, a center tap of the secondary coil of the transformer, and a ground voltage.

The first unit include: a first transistor connected between a power source voltage and a positive output port, and turned on or off by the input signal transmitted via the first switching unit.

The second unit include: a second transistor connected between a negative output port and a ground voltage, and turned on or off by the input signal transmitted via the second switching unit.

The third unit include: a third transistor connected between the power source voltage and a positive output port, and turned on or off by a transmission signal which has been applied to a positive transmission node.

The fourth unit include: a fourth transistor connected between a negative output port and a ground voltage, and turned on or off by a reverse transmission signal which has been applied to a negative transmission node.

The first and second switching units form a signal path connecting the input port and the first and second active units in the reception mode, the third and fourth switching units form a signal path connecting the pair of output ports and the pair of reception nodes in the reception mode and form a signal path connecting the pair of output ports and the pair of transmission nodes in the transmission mode.

The first switching unit comprises: a fifth transistor connected between the input port and the first active unit and turned on or off by a reception mode signal; a sixth transistor connected between a power source voltage and the first active unit, and turned on or off by the reception mode signal; and a seventh transistor connected between the first active unit and the ground voltage, and turned on or off by a transmission mode signal, and transfers the input signal which has been applied to the input port, to the first active unit if only the reception mode signal is activated.

The second switching unit comprises: an eighth transistor connected between the input port and the second active unit, and turned on or off by a reception mode signal; a ninth transistor connected between the second active unit and a bias voltage, and turned on or off by the reception mode signal; and a tenth transistor connected between the second active unit and a ground voltage, and turned on or off by a transmission mode signal, and transfers the input signal, which has been applied to the input port, to the second active unit if only the reception mode signal is activated.

The third switching unit comprises: an 11th transistor connected between a positive output port of the transformer and a positive reception node, and turned on or off by a reception mode signal; a 12th transistor connected between a positive transmission node and a ground voltage, and turned on or off by the reception mode signal; and a 13th transistor connected with the power source voltage and the positive transmission node, and turned on or off by the transmission mode signal, and when the reception mode signal is activated, the third switching unit transfers a signal, which has been applied to the positive output port of the transformer, to the positive transmission node, and when the transmission mode signal is activated, the third switching unit transfers a signal, which has been applied to the positive transmission node, to the positive output port of the transformer.

The fourth switching unit comprises: a 14th transistor connected between a negative output port of the transformer and a negative reception node, and turned on or off by a reception mode signal; a 15th transistor connected between a negative transmission node and a ground voltage, and turned on or off by the reception mode signal; a 16th transistor connected between the negative transmission node and the ground voltage, and turned on or off by a transmission mode signal, and when the reception mode signal is activated, the fourth switching unit transfers a signal, which has been applied to the negative output port of the transformer, to the negative transmission node, and when the transmission mode signal is activated, the fourth switching unit transfers a signal, which has been applied to the negative transmission node, to the negative (−) output port.

The transformer comprises: a first conductive pattern for implementing a primary coil; a second conductive pattern for implementing a secondary coil; a third conductive pattern for implementing a tap terminal of the secondary coil, wherein both ends of the first conductive pattern, both ends of the second conductive pattern, and the third conductive pattern are adjacently disposed.

The first conductive pattern is an inductor pattern having both ends connected to the input port and the ground voltage and having a plurality of loop-type conducting wires formed based on a central point and connected in series.

The second conductive pattern is an inductor pattern having both ends connected to the pair of output ports and having a plurality of loop-type conducting wires disposed to be adjacent to the first conductive pattern and connected in series.

The third conductive pattern is a single linear inductor pattern having both ends connected with a center tap of the second conductive pattern and the ground voltage.

The first to third conductive patterns each are implemented with a different metal at a region where they cross each other.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
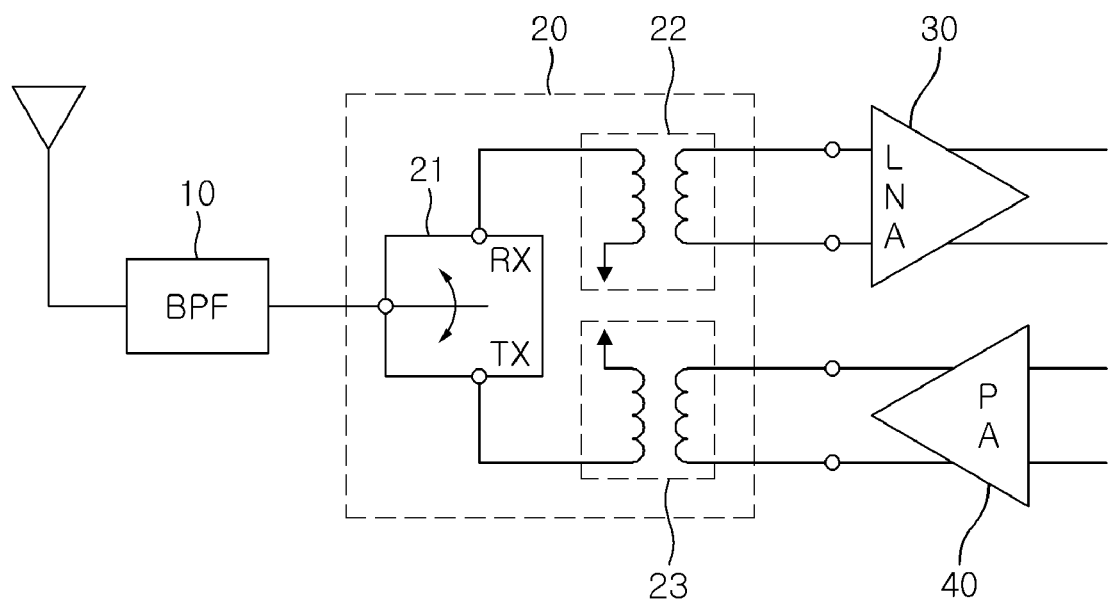
FIG. 1 illustrates the configuration of the prior art hybrid balun apparatus.

Exemplary embodiments of the present invention will now be described in detail with reference to the accompanying drawings. The invention may however be embodied in many different forms and should not be construed as limited to the embodiments set forth herein. Rather, these embodiments are provided so that this disclosure will be thorough and complete, and will fully convey the scope of the invention to those skilled in the art.

In the drawings, the shapes and dimensions may be exaggerated for clarity, and the same reference numerals will be used throughout to designate the same or like components.

In addition, unless explicitly described to the contrary, the word "comprise" and variations such as "comprises" or "comprising," will be understood to imply the inclusion of stated elements but not the exclusion of any other elements.

Exemplary embodiments of the present invention will now be described with reference to the accompanying drawings.

Figure 2:
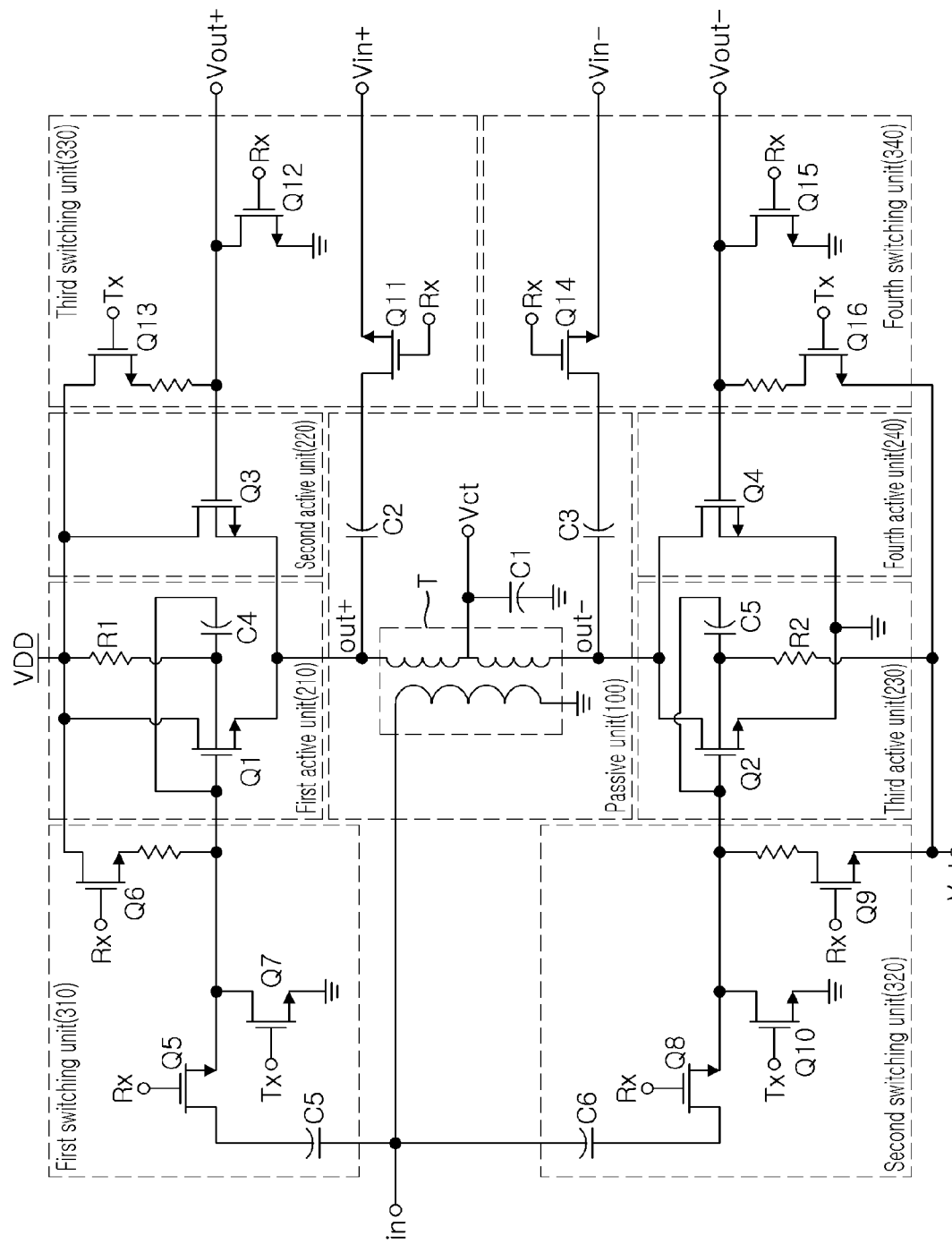
FIG. 2 illustrates a hybrid balun apparatus according to an exemplary embodiment of the present invention.

FIG. 2 illustrates a hybrid balun apparatus according to an exemplary embodiment of the present invention.

With reference to FIG. 2, the hybrid balun apparatus according to an exemplary embodiment of the present invention includes a passive unit 100, a first to fourth active units 210 to 240, and a first to fourth active units 310 to 340.

The passive unit 100 has a single transformer (T), which generates a pair of reception signals corresponding to an input signal applied to an input port (in) and outputs the pair of reception signals to a pair of output ports (out+ and out−), or generates a single-ended signal, namely, an output signal, corresponding to a pair of transmission signals applied to the pair of output ports (out+ and out−) and outputs the output signal to the input port (in).

The first and second active units 210 and 220 generate a pair of compensation reception signals corresponding to the input signal and apply the pair of generated compensation reception signals to the pair of output ports (out+ and out−).

The third and fourth active units 230 and 240 apply the pair of transmission signals, which have been applied to a pair of transmission nodes (Vout+ and Vout−), to the pair of output ports (out+ and out−).

The first to fourth switching units 310 to 340 form a reception path along which the input signal, which has been applied to the input port (in), is transferred to a pair of reception nodes (Vin+ and Vin−) via the transformer (T) and the first and second active units 210 and 220 in a reception mode. Also, the first to fourth switching units 310 to 340 form a transmission path along which the pair of transmission signals, which have been applied to a pair of transmission nodes (Vout+ and Vout−), are output to the input port (in) via the third and fourth active units 230 and 240 and the transformer (T).

In here, the first and second switching units 310 and 320 form a signal path connecting the input port (in) and the first and second active units 210 and 220 in the reception mode. And the third and fourth switching units 330 and 340 form a signal path connecting the pair of output ports (out+ and out−) of the transformer (T) and the pair of reception nodes (Vin+ and Vin−) in the reception mode, or form a signal path connecting the pair of output ports (out+ and out−) of the transformer (T) and the pair of transmission nodes (Vout+ and Vout−) in the transmission mode.

The detailed configuration of the hybrid balun apparatus according to an exemplary embodiment of the present invention will now be described.

The passive unit 100 includes a transformer (T) including a primary coil having one end connected to the input port (in) and the other end connected to a ground voltage GND and a secondary coil electromagnetically connected with the primary coil and having both ends connected to the pair of output ports (out+ and out−); and a first capacitor C1 connected between a bias voltage Vct (or a center tap of the secondary coil of the transformer (T)) and a ground voltage GND, a second capacitor C2 connected to the positive output port (out+), and a third capacitor C3 connected to the negative output port (out−).

The first active unit 210 includes a first transistor Q1 connected between a power source voltage VDD and the positive output port (out+) and turned on or off by an input signal transmitted via the first switching unit 310, a fourth capacitor C4 connected between a body and a gate of the first transistor Q1, and a first resistor R1 connected between the power source voltage VDD and the body of the first transistor Q1.

The second active unit 220 includes a second transistor Q2 connected between the negative output port (−out) and a ground voltage GND and turned on or off by the input signal transmitted via the second switching unit 320, a fifth capacitor C5 connected between a body and gate of the second transistor Q2, and a second resistor R2 connected between the body of the second transistor Q2 and a bias voltage Vct.

The third active unit 230 includes a third transistor Q3 connected between the power source voltage VDD and the positive output port (out+) and turned on or off by a transmission signal which has been applied to a positive transmission node (Vout+).

The fourth active unit 240 includes a fourth transistor Q4 connected between the negative output port (out−) and turned on or off by a reverse transmission signal which has been applied to a negative transmission node (Vout−).

The first switching unit 310 includes a fifth transistor Q5 connected between the input port (in) and the gate of the first transistor Q1 and turned on or off by a reception mode signal Rx, a sixth transistor Q6 connected between the power source voltage VDD and the gate of the first transistor Q1 and turned on or off by a reception mode signal Rx, and a seventh transistor Q7 connected between the gate of the first transistor Q1 and a ground voltage GND and turned on or off by a transmission mode signal Tx. If necessary, the first switching unit 310 may further include a fifth capacitor C5 connected between the input port (in) and the fifth transistor Q5 to remove a DC component of the input signal.

The second switching unit 320 includes an eighth transistor Q8 connected between the input port (in) and the gate of the second transistor Q2 and turned on or off by a reception mode signal Rx, a ninth transistor Q9 connected between the gate of the second transistor Q2 and the bias voltage Vct and turned on or off by a reception mode signal Rx, and a tenth transistor Q10 connected between the gate of the second transistor Q2 and a ground voltage GND and turned on or off by a transmission mode signal Tx. If necessary, the second switching unit 320 may further include a sixth capacitor C6 connected between the input port (in) and the eighth transistor Q8 to remove a DC component of the input signal.

The third switching unit 330 includes an $11^{th}$ transistor Q11 connected between the second capacitor C2 of the passive unit 100 and the positive reception node (Vin+) and turned on or off by a reception mode signal Rx, a $12^{th}$ transistor Q12 connected between the positive transmission node (Vout+) (or a gate of the third transistor Q3) and a ground voltage GND, and turned on or off by a reception mode signal Rx, and a $13^{th}$ transistor Q13 connected between the power source voltage VDD and the positive transmission node (Vout+) (or and the gate of the third transistor Q3), and turned on or off by a transmission mode signal Tx.

The fourth switching unit 340 includes a $14^{th}$ transistor Q14 connected between the third capacitor C3 of the passive unit 100 and the negative reception node (Vin−) and turned on or off by a reception mode signal Rx, a $15^{th}$ transistor Q15 connected between a negative transmission node (Vout−) (or a gate of the fourth transistor) and a ground voltage GND, and turned on or off by a reception mode signal Rx, and a $16^{th}$ transistor Q16 connected between the negative transmission node (Vout−) (or a gate of the fourth transistor Q4) and the bias voltage Vct, and turned on or off by a transmission mode signal Tx.

According to the exemplary embodiment of the present invention, the transistors are implemented as NMOS transistors or PMOS transistors. A 'power source voltage (VDD)/2' is set as the bias voltage Vct, which is supplied as a gate voltage to each transistor and applied to the center tap. Also, in order to increase the gain of the transistors, the transistors are connected such that a DC voltage is applied via the body of each transistor and an AC voltage is applied via each capacitor.

Figure 3A:
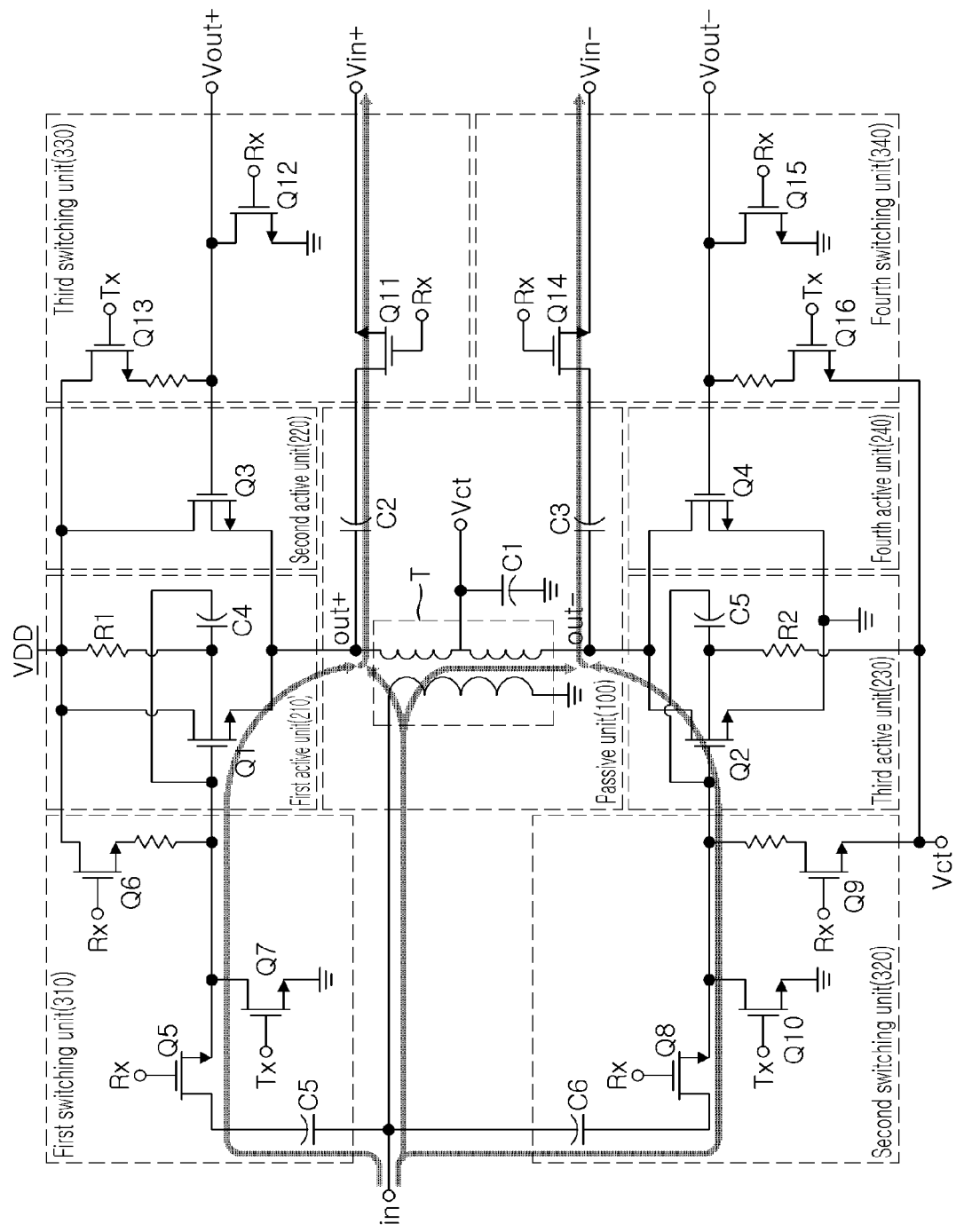
FIGS. 3A and 3B illustrate the operation of the hybrid balun apparatus according to an exemplary embodiment of the present invention.
Figure 3B:
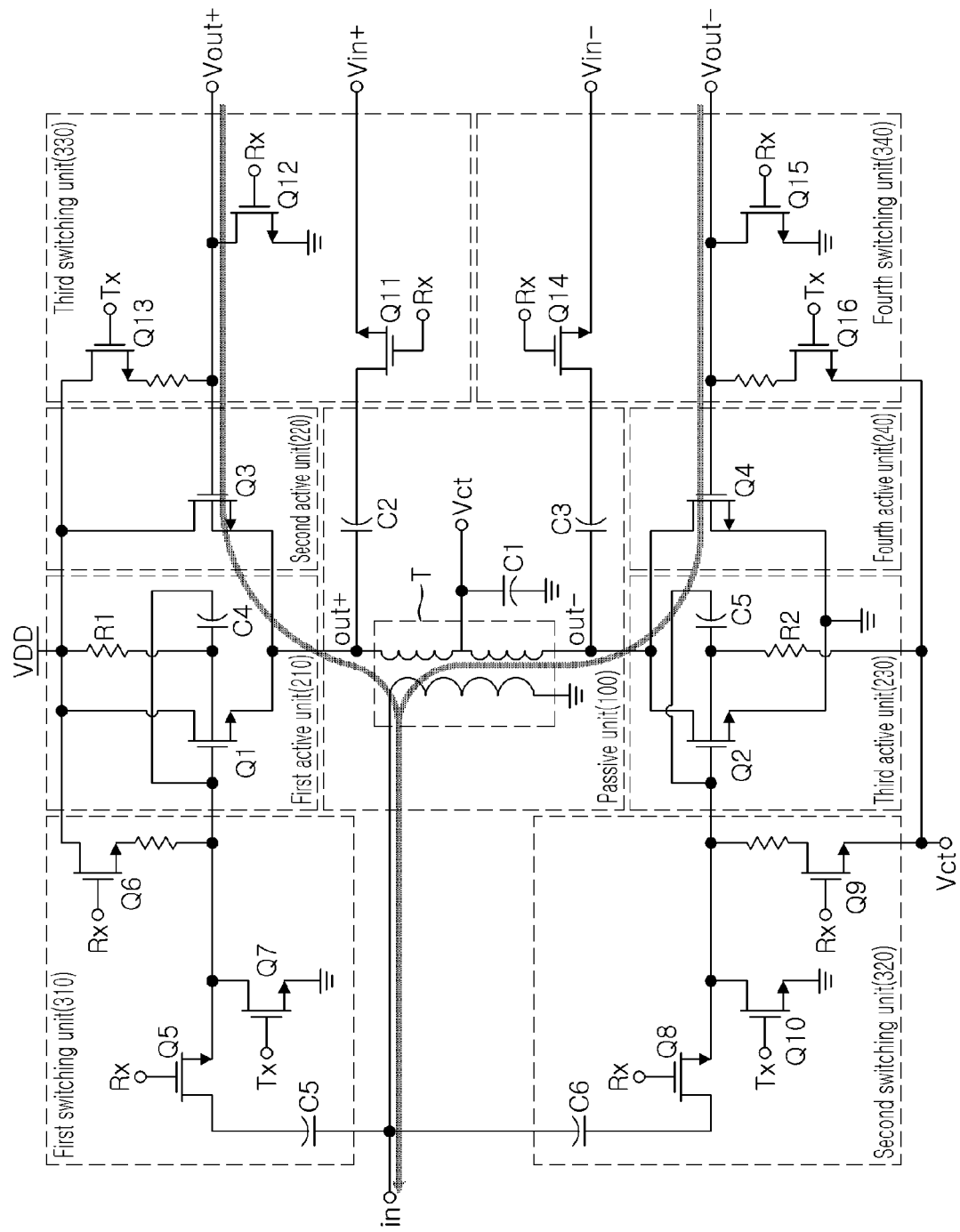

The operation of the hybrid balun apparatus configured as shown in FIG. 2 will now be described with reference to FIGS. 3A and 3B.

In an exemplary embodiment of the present invention, it is assumed that a reception mode signal Rx is set to be high ('H') and a transmission mode signal Tx is set to be low ('L') in a reception mode, and a reception mode signal Rx is set to be low ('L') and a transmission mode signal is set to be high ('H') in a transmission mode, for the sake of brevity.

First, the operation of the hybrid balun apparatus in the reception mode will now be described with reference to FIG. 3a.

When the high (H) reception mode signal Rx and the low (L) transmission mode signal Tx are input, the first and second switching units 310 and 320 form a signal path connecting the input port (in) and the first and second active units 210 and 220, an the third and fourth switching units 330 and 340 form a signal path connecting each of the pair of output ports (out+ and out−) to each of the pair of reception nodes (Vin+ and Vin−) and a signal path connecting the pair of transmission nodes (Vout+ and Vout−) to the ground voltage GND.

Namely, in the reception mode, the signal path, allowing an input signal which has been applied to the input port (in) to pass through the first and second active units 210 and 220 so as to be transferred to the pair of reception nodes Vin+ and Vin−, is formed in the hybrid balun apparatus.

In this state, when an input signal is applied to the input port (in), the input signal is transferred to the primary coil of the transformer (T) of the passive unit 100, the first transistor Q1 of the first active unit 210, and the second transistor Q2 of the second active unit 220 through the signal path formed as described above.

Then, the transformer (T) of the passive unit 100 generates a pair of reception signals (i.e., a reception signal and a reverse reception signal) corresponding to the input signal, and outputs the generated pair of reception signals to the pair of output ports (out+ and out−). And, at the same time, the first transistor Q1 of the first active unit 210 and the second transistor Q2 of the second active unit 220 generate a pair of compensation signals (i.e., a compensation signal and a reverse compensation signal) corresponding to the input signal and output the generated pair of compensation signals to the output ports (out+ and out−).

Accordingly, a loss of the pair of reception signals which have been applied to the pair of output ports (out+ and out−) is compensated by the pair of compensation signals, and then the pair of reception signals are output to the pair of reception nodes (Vin+ and Vin−).

The operation of the hybrid balun apparatus in the transmission mode will now be described with reference to FIG. 3B.

When the low (L) reception mode signal Rx and the high (H) transmission mode signal (Tx) are input, the third and fourth switching units 330 and 340 form a signal path connecting each of the pair of transmission nodes (Vout+ and Vout−) to each of the pair of output ports (out+ and out−). Meanwhile, the first and second switching units 310 and 320 connect the gates of the first and second transistors Q1 and Q2 of the first and second active units 210 and 220 to the ground voltage GND.

Namely, in the transmission mode, only the signal path, allowing the pair of transmission signals which have been applied to the pair of transmission nodes (Vout+ and Vout−) to pass through the third and fourth active units 230 and 240 and the transformer (T) so as to be output to the input port (in), is formed in the hybrid balun apparatus.

In this state, when the pair of transmission signals are applied to the pair of transmission nodes (Vout+ and Vout−), the pair of transmission signals are applied to the both ends of the secondary coil of the transformer (T), namely, to the pair of output ports (out+ and out−), through the signal path formed as described above.

Then, the transformer (T) generates a single output signal, i.e., a single-ended signal, corresponding to the pair of transmission signals which have been applied to the pair of output ports (out+ and out−), and outputs the generated output signal to the input port (in).

In this manner, in the present invention, the RF switch and the balun are integrated, the reception and transmission modes can be supported, and two baluns, which are installed respectively at a reception path and a transmission path in the related art, can be replaced by a single balun.

Also, the present invention proposes a transformer with a new structure that a connection distance between the input port and the transistors is shortened so as to minimize the generation of a parasitic component caused by routing.

The structure of transformer proposed by the present invention will now be described in detail.

Figure 4:
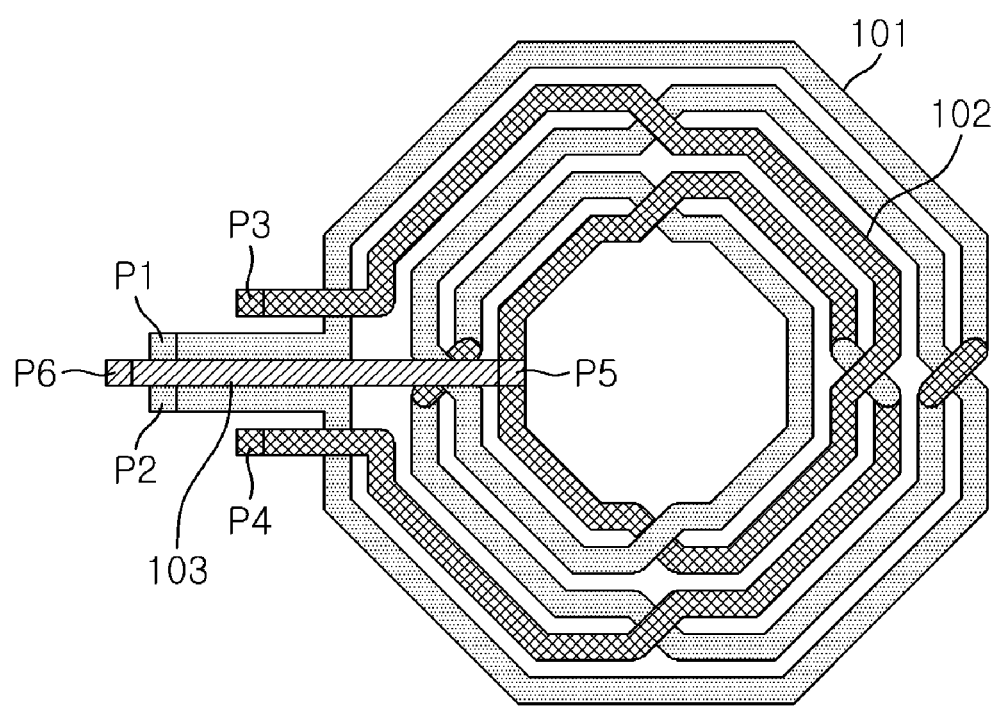
FIG. 4 illustrates the structure of a transformer according to an exemplary embodiment of the present invention.

FIG. 4 illustrates the structure of a transformer according to an exemplary embodiment of the present invention.

With reference to FIG. 4, the transformer includes a first conductive pattern 101 implementing a primary coil, a second conducive pattern 102 implementing a secondary coil, and a third conductive pattern 103 implementing a center tap of the secondary coil. Both ends P1 and P2 of the first conductive pattern 101, both ends P3 and P4 of the second conductive pattern 102, and the third conductive pattern are all disposed to be adjacent to each other.

The reason for adjacently disposing all of the both ends P1 and P2 of the first conductive pattern 101, the both ends P3 and P4 of the second conductive pattern 102, and the third conductive pattern 103 is to minimize a connection distance between the input port (in) and the transistors of the first to fourth active units.

With reference to FIG. 4, the first conductive pattern 101 is an inductor pattern having the both ends connected with the input port (in) and the ground voltage GND, and formed as a plurality of loop type conducting wires formed centering around a certain central point (0) are connected in series.

The second conductive pattern 102 is an inductor pattern having the both ends P3 and P4, of which the end P3 is connected to the pair of output ports (out+ and out−), and formed as a plurality of loop type conducting wires disposed to be adjacent to the first conductive pattern 101 centering around the same central point (0) are connected in series.

The reason for adjacently disposing the first and second conductive patterns 101 and 102 is to allow the first and second conductive patterns 101 and 102 to be electromagnetically combined. In addition, the number of loops (or the number of turns), a pattern width, a pattern gap, and the like, of the first and second conductive patterns 101 and 102 may be determined depending on the performance of the transformer.

The third conductive pattern 103 is a single linear type inductor pattern having both ends P5 and P6 connecting the center tap of the second conducive pattern 102 to the ground GND.

The first to third conductive patterns 101 to 103 are formed on the same plane but may be implemented with different metals at regions where the conductive patterns cross. This is to prevent signals transferred through the conductive patterns from being interfered with by each other.

For example, if the first conductive patterns cross each other, the first conductive pattern 101 formed at an upper region and the first conductive pattern 101 formed at a lower region may be implemented with different metals. This is applied in the same manner if the second conductive patterns 102 cross each other, if the first and second conductive patterns 101 and 102 cross each other, and if the first to third conductive patterns 101 to 103 cross each other.

Figure 5A:
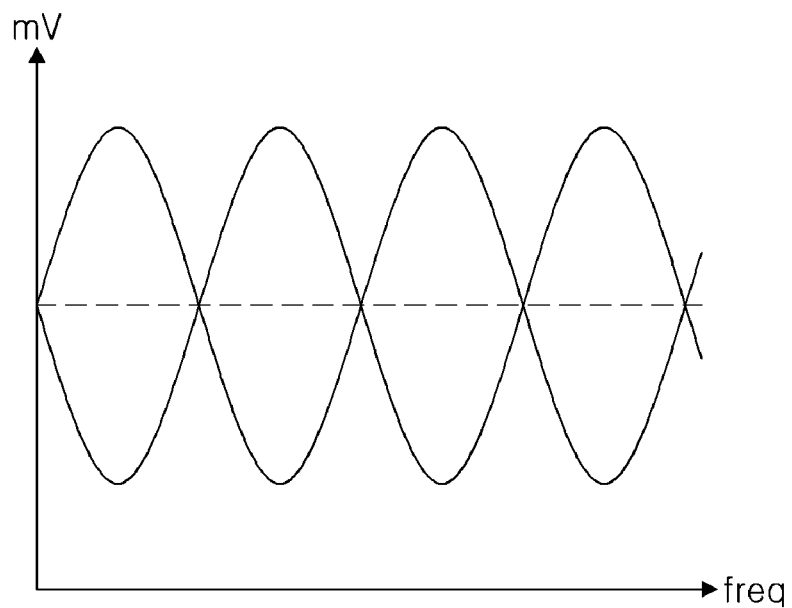
FIGS. 5A and 5B are graphs showing the signal characteristics of signals input or output via the hybrid balun apparatus according to an exemplary embodiment of the present invention.
Figure 5B:
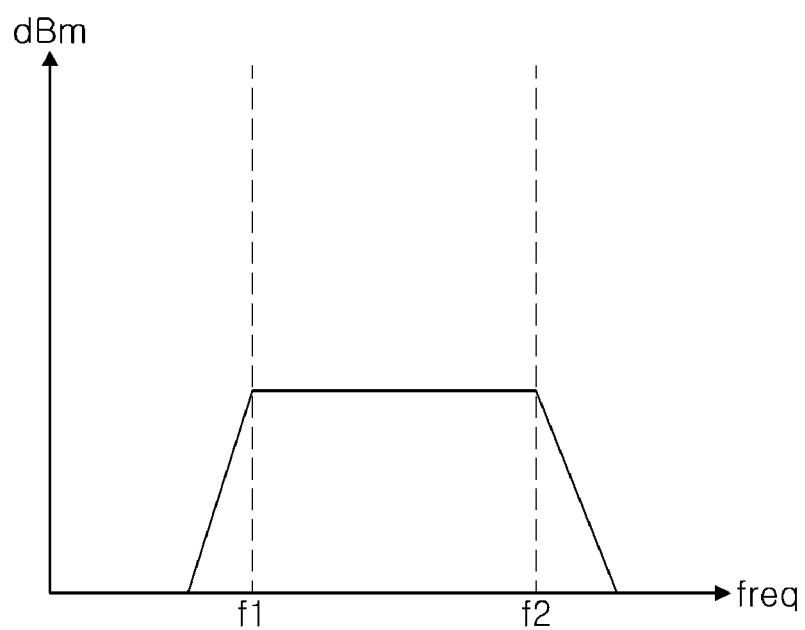

FIGS. 5A and 5B are graphs showing signal characteristics of signals input or output via the hybrid balun apparatus according to an exemplary embodiment of the present invention. Specifically, FIG. 5A shows a pair of signals output to the pair of reception nodes (Vin+ and Vin−) in the reception mode, and FIG. 5B shows a signal output to the input port (in) in the transmission mode.

In the reception mode, as shown in FIG. 5A, the hybrid balun apparatus according to an exemplary embodiment of the present invention generates the pair of reception signals having a 180° phase difference from the input signal applied to the input port (in) and outputs the same.

In the transmission mode, as shown in FIG. 5B, the hybrid balun apparatus according to an exemplary embodiment of the present invention generates a single output signal corresponding to the pair of transmission signals applied to the pair of transmission nodes (Vout+ and Vout−) and outputs the same to the input port (in).

As set forth above, the hybrid balun apparatus according to exemplary embodiments of the invention can support both the reception mode and the transmission mode and be advantageous for a high level of integration, by replacing two transformers disposed at a reception path and a transmission path with a single transformer and integrating a T/R switch and a balun into a one chip.

Therefore, an IC according to integration extends to a front stage of an antenna to facilitate interfacing between elements, and a burden for designing at a rear stage (i.e., LNA in the reception mode, and PA in the transmission mode) can be reduced.

While the present invention has been shown and described in connection with the exemplary embodiments, it will be apparent to those skilled in the art that modifications and variations can be made without departing from the spirit and scope of the invention as defined by the appended claims.

What is claimed is:

1. A hybrid balun apparatus comprising:
   a passive unit having a single transformer that generates a pair of reception signals corresponding to an input signal applied to an input port and outputs the pair of reception signals to a pair of output ports, or generates an output signal corresponding to a pair of transmission signals applied to the pair of output ports and outputs the output signal to the input port;
   first and second active units that generate a pair of compensation reception signals corresponding to the input signal and apply the pair of generated compensation reception signals to the pair of output ports;
   third and fourth active units that apply the pair of transmission signals to the pair of output ports; and
   first to fourth switching units that form a reception path along which the input signal is transferred to a pair of reception nodes via the transformer and the first and second active units in a reception mode, and form a transmission path along which the pair of transmission signals, which have been applied to a pair of transmission nodes, are output to the input port via the third and fourth active units and the transformer.

2. The apparatus of claim 1, wherein the passive unit comprises:
   a transformer including a primary coil having one end connected to the input port and the other end connected to a ground voltage, and a secondary coil electromagnetically connected with the primary coil and having both ends connected to the pair of output ports; and
   a first capacitor connected between a bias voltage and a ground voltage.

3. The apparatus of claim 1, wherein the first unit comprises:
   a first transistor connected between a power source voltage and a positive output port, and turned on or off by the input signal transmitted via the first switching unit.

4. The apparatus of claim 1, wherein the second unit comprises:
   a second transistor connected between a negative output port and a ground voltage, and turned on or off by the input signal transmitted via the second switching unit.

5. The apparatus of claim 1, wherein the third unit comprises:
   a third transistor connected between the power source voltage and a positive output port, and turned on or off by a transmission signal which has been applied to a positive transmission node.

6. The apparatus of claim 1, wherein the fourth unit comprises:
   a fourth transistor connected between a negative output port and a ground voltage, and turned on or off by a reverse transmission signal which has been applied to a negative transmission node.

7. The apparatus of claim 1, wherein the first and second switching units form a signal path connecting the input port and the first and second active units in the reception mode, the third and fourth switching units form a signal path connecting the pair of output ports and the pair of reception nodes in the reception mode and form a signal path connecting the pair of output ports and the pair of transmission nodes in the transmission mode.

8. The apparatus of claim 7, wherein the first switching unit comprises:
   a fifth transistor connected between the input port and the first active unit and turned on or off by a reception mode signal;
   a sixth transistor connected between a power source voltage and the first active unit, and turned on or off by the reception mode signal; and
   a seventh transistor connected between the first active unit and the ground voltage, and turned on or off by a transmission mode signal,
   and transfers the input signal which has been applied to the input port, to the first active unit if only the reception mode signal is activated.

9. The apparatus of claim 7, wherein the second switching unit comprises:
   an eighth transistor connected between the input port and the second active unit, and turned on or off by a reception mode signal;
   a ninth transistor connected between the second active unit and a bias voltage, and turned on or off by the reception mode signal; and
   a tenth transistor connected between the second active unit and a ground voltage, and turned on or off by a transmission mode signal, and
   transfers the input signal, which has been applied to the input port, to the second active unit if only the reception mode signal is activated.

10. The apparatus of claim 7, wherein the third switching unit comprises: an eleventh transistor connected between a positive output port of the transformer and a positive reception node, and turned on or off by a reception mode signal; a twelfth transistor connected between a positive transmission node and a ground voltage, and turned on or off by the reception mode signal; and
    a thirteenth transistor connected with the power source voltage and the positive transmission node, and turned on or off by the transmission mode signal, and when the reception mode signal is activated, the third switching unit transfers a signal, which has been applied to the positive output port of the transformer, to the positive transmission node, and when the transmission mode signal is activated, the third switching unit transfers a signal, which has been applied to the positive transmission node, to the positive output port of the transformer.

11. The apparatus of claim 7, wherein the fourth switching unit comprises: a fourteenth transistor connected between a negative output port of the transformer and a negative reception node, and turned on or off by a reception mode signal; a fifteenth transistor connected between a negative transmission node and a ground voltage, and turned on or off by the reception mode signal; a 16th transistor connected between the negative transmission node and the ground voltage, and turned on or off by a transmission mode signal, and when the reception mode signal is activated, the fourth switching unit transfers a signal, which has been applied to the negative output port of the transformer, to the negative transmission node, and when the transmission mode signal is activated, the fourth switching unit transfers a signal, which has been applied to the negative transmission node, to the negative (−) output port.

12. The apparatus of claim 1, wherein the transformer comprises:
a first conductive pattern for implementing a primary coil;
a second conductive pattern for implementing a secondary coil;
a third conductive pattern for implementing a tap terminal of the secondary coil,
wherein both ends of the first conductive pattern, both ends of the second conductive pattern, and the third conductive pattern are adjacently disposed.

13. The apparatus of claim 12, wherein the first conductive pattern is an inductor pattern having both ends connected to the input port and the ground voltage and having a plurality of loop-type conducting wires formed based on a central point and connected in series.

14. The apparatus of claim 13, wherein the second conductive pattern is an inductor pattern having both ends connected to the pair of output ports and having a plurality of loop-type conducting wires disposed to be adjacent to the first conductive pattern and connected in series.

15. The apparatus of claim 12, wherein the third conductive pattern is a single linear inductor pattern having both ends connected with a center tap of the second conductive pattern and the ground voltage.

16. The apparatus of claim 12, wherein the first to third conductive patterns each are implemented with a different metal at a region where they cross each other.

* * * * *